(12) United States Patent
Dean et al.

(10) Patent No.: US 7,548,928 B1
(45) Date of Patent: Jun. 16, 2009

(54) DATA COMPRESSION OF LARGE SCALE DATA STORED IN SPARSE TABLES

(75) Inventors: Jeffrey A. Dean, Palo Alto, CA (US); Sanjay Ghemawat, Mountain View, CA (US)

(73) Assignee: Google Inc., Mountain View, CA (US)

( * ) Notice: Subject to any disclaimer, the term of this patent is extended or adjusted under 35 U.S.C. 154(b) by 552 days.

(21) Appl. No.: 11/197,922

(22) Filed: Aug. 5, 2005

(51) Int. Cl.
*G06F 17/30* (2006.01)

(52) U.S. Cl. .................... 707/101; 707/104.1

(58) Field of Classification Search .............. None
See application file for complete search history.

(56) References Cited

U.S. PATENT DOCUMENTS

| | | | | |
|---|---|---|---|---|
| 5,386,559 | A | 1/1995 | Eisenberg et al. | 395/600 |
| 5,414,834 | A | 5/1995 | Alexander et al. | 395/600 |
| 5,794,228 | A | 8/1998 | French et al. | 707/2 |
| 5,918,225 | A | 6/1999 | White et al. | 707/3 |
| 5,946,699 | A * | 8/1999 | Sawashima et al. | 707/203 |
| 5,953,503 | A * | 9/1999 | Mitzenmacher et al. | 709/203 |
| 6,006,232 | A | 12/1999 | Lyons | 707/101 |
| 6,169,990 | B1 | 1/2001 | McGregor et al. | 707/101 |
| 6,233,580 | B1 * | 5/2001 | Kaplan et al. | 707/101 |
| 6,289,358 | B1 | 9/2001 | Mattis et al. | 707/203 |
| 6,298,342 | B1 | 10/2001 | Graefe et al. | 707/4 |
| 6,725,225 | B1 | 4/2004 | Kori | 707/101 |
| 6,778,996 | B2 | 8/2004 | Roccaforte | 707/104 |
| 6,879,984 | B2 | 4/2005 | Duddleson et al. | 707/101 |
| 6,909,384 | B2 * | 6/2005 | Baldwin et al. | 341/55 |
| 6,937,171 | B2 * | 8/2005 | Baldwin et al. | 341/87 |
| 7,013,304 | B1 * | 3/2006 | Schuetze et al. | 707/100 |
| 7,024,414 | B2 | 4/2006 | Sah et al. | 707/101 |
| 7,026,964 | B2 * | 4/2006 | Baldwin et al. | 341/87 |
| 7,028,039 | B2 * | 4/2006 | Burrows et al. | 707/101 |
| 7,103,588 | B2 | 9/2006 | Beck et al. | 707/2 |
| 7,103,608 | B1 | 9/2006 | Ozbutun et al. | 707/102 |
| 7,181,457 | B2 | 2/2007 | Reinauer et al. | 707/10 |
| 2002/0178171 | A1 | 11/2002 | Walker et al. | 707/102 |

(Continued)

OTHER PUBLICATIONS

Gennady Antoshenkoy, Dictionary-based order-preserving string compression, Feb. 1997, Springer-Verlag New York, Inc., vol. 6, Issue 1, pp. 26-39.*

(Continued)

*Primary Examiner*—Christian P. Chace
*Assistant Examiner*—Jacques Veillard
(74) *Attorney, Agent, or Firm*—Morgan, Lewis & Bockius LLP

(57) ABSTRACT

A method of compressing data in a table data structure begins by accessing a data set within the table data structure, the data set having associated therewith a range of rows of the table data structure. Data items in the data set are represented by key-value pairs. The method includes applying a first compression to the values of the key-value pairs in the data set to produce a first compressed output; applying a second compression, distinct from the first compression, to the keys of the key-value pairs in the data set to produce a second compressed output; and applying a third compression to the first compressed output and second compressed output to produce a first compressed output block, wherein the third compression is distinct from the first compression and second compression.

24 Claims, 11 Drawing Sheets

U.S. PATENT DOCUMENTS

| | | | |
|---|---|---|---|
| 2003/0200235 A1 | 10/2003 | Choy et al. | 707/203 |
| 2004/0148301 A1 | 7/2004 | McKay et al. | 707/101 |
| 2005/0149584 A1 | 7/2005 | Bourbonnais et al. | 707/204 |
| 2005/0219076 A1 | 10/2005 | Harris | 341/51 |
| 2006/0123035 A1 | 6/2006 | Ivie | 707/101 |

OTHER PUBLICATIONS

Zhiyuan Chen et al., Query optimization in compressed database systems, Year 2001, ACM, pp. 271-282.*

Barroso, L., et al., "Memory System Characterization of Commercial Workloads," Proceedings of the 25th International Symposium on Computer Architecture, Barcelona, Jun. 1998, pp. 3-14.

Elmasri, R., et al., Portions of Chapters 24 and 25 of Fundamentals of Database Systems, Addison-Wesley, Reading, MA, 2004, pp. 767-819.

Gamal-Eldin, M.S., et al., "Integrating Relational Databases with Support for Updates," Proceedings of 1988 Int'l Symposium on Databases in Parallel and Distributed Systems, Dec. 5, 1988, pp. 202-209.

Kouramajian, V., et al., "Mapping of 2-D Temporal Extended ER models in Temporal FNF and NFNF Relational Models," Int'l Conf on the Entity-Relationship Approach, Amsterdam, Netherlands, Oct. 23, 1991, pp. 671-689.

Bentley, J., et al., "Data Compression Using Long Common Strings," *Proceedings of the IEEE Data Compression Conf.*, Mar. 1999, pp. 287-295.

* cited by examiner

Physical Storage of Locality Group Files (key- value pairs)

| Row.ColFam.Col.Timestamp | Value |
|---|---|
| Row.ColFam.Col.Timestamp | Value |

DATA COMPRESSION OF LARGE SCALE DATA STORED IN SPARSE TABLES

RELATED APPLICATIONS

This application is related to U.S. patent application Ser. No. 11/197,925, "Large Scale Data Storage in Sparse Tables," filed Aug. 5, 2005, which application is incorporated by reference herein in its entirety.

This application is related to U.S. patent application Ser. No. 11/197,924, "Storing a Sparse Table Using Locality Groups", filed Aug. 5, 2005, which application is incorporated by reference herein in its entirety.

This application is related to U.S. patent application Ser. No. 11/197,923, "Data Reconstruction from Shared Update Log", filed Aug. 5, 2005, which application is incorporated by reference herein in its entirety.

TECHNICAL FIELD

The disclosed embodiments relate generally to data storage in distributed computer systems, and more particularly to data compression of data stored in sparse tables.

BACKGROUND

Table data structures, and particularly tables in database management systems, are used to store large amounts of data. The demand for efficient data storage for a variety of data intensive applications continues to grow. However, for many such data intensive applications, table data structures have been assumed to be an inappropriate mechanism for storing much of the data generated or obtained by those applications. Furthermore, there appears to be little appreciation that the paradigms associated with table data structures would be very useful in those applications.

For instance, the web pages downloaded during a crawl of the World Wide Web (WWW) are typically stored as a set of files, not as entries in a table or a database table. Similarly, RSS feeds (which can be considered to be documents) downloaded by RSS feed aggregators and other computers are typically stored as files. Storing web content, RSS feed content and the like as individual files is traditional and the mechanisms for managing and accessing such files are well established. The present invention, on the other hand, provides a data model and a set of data management processes and mechanisms for storing large amounts of data in one or more table data structures, thereby providing an alternative to the traditional model of storing individual content items in individual files.

A challenge associated with storing massive amounts of data in table data structures is achieving efficient compression, and very high speed decompression of compress data that is infrequently, if ever, updated. Numerous data compression methods for individual files are well established. However, when the stored data includes data items having numerous versions, some of which may be identical or highly similar to each other, as well as distinct but related data items that may also have significant amounts of overlapping or shared content, there is a need for new data compression and decompression processes that take advantage of the large amount of redundancy in the data, that provide good compression despite the fact that some of the data items may be large (e.g., multiple megabytes in length) and thus have common content that is separated by large "distances" in memory, and that provide extremely fast decompression so that access to the compressed data is not significantly hampered by its storage in compressed form.

SUMMARY

A method of compressing data in a table data structure begins by accessing a data set within the table data structure, the data set having associated therewith a range of rows of the table data structure. Data items in the data set are represented by key-value pairs. The method includes applying a first compression to the values of the key-value pairs in the data set to produce a first compressed output; applying a second compression, distinct from the first compression, to the keys of the key-value pairs in the data set to produce a second compressed output; and applying a third compression to the first compressed output and second compressed output to produce a first compressed output block, wherein the third compression is distinct from the first compression and second compression.

Another embodiment is a method of decompressing data. In response to a request for a value corresponding to a specified key, the method accesses a compressed data block corresponding to the specified key, wherein the compressed data block includes keys, compressed data values corresponding to the compressed data values, and pointers that link the keys to the compressed data values. The compressed data values include sequences of one or more copy codes and add codes, wherein a plurality of the copy codes reference ranges of positions within the compressed data values and the add codes specify literal data strings. The method further includes locating, within the compressed data block, the specified key and the associated pointer that links the specified key to a compressed value in the compressed data block. Then, the compressed value is decoded to produce a decompressed value comprising an output string, including: for each add code, if any, in the compressed value, adding the literal data string to the output string; for each copy code, if any, that references a range of locations within the compressed data block, copying into the output string a string of data from the referenced range of locations within the compressed data block; and for each copy code, if any, that references a range of locations in the output string, copying into the output string a string of data from the referenced range of locations in the output string.

BRIEF DESCRIPTION OF THE DRAWINGS

FIG. 5A is a block diagram of the files and memory state used by one server to store tablets (portions of tables) and updates to the tablets, while FIG. 5B is a block diagram of the content of a single data file, sometimes called a locality group file.

Like reference numerals refer to corresponding parts throughout the drawings.

DESCRIPTION OF EMBODIMENTS

Figure 1:
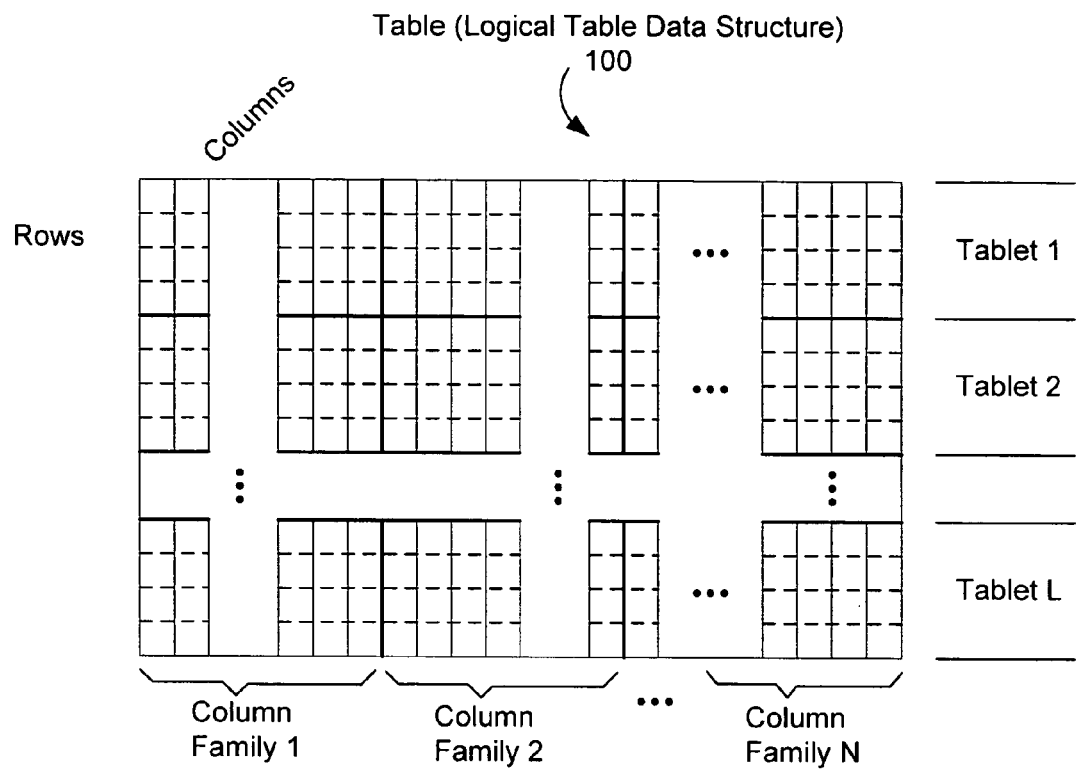
FIG. 1 is a conceptual block diagram of a table data structure.

FIG. 1 is a conceptual block diagram of a table data structure 100. Like an ordinary table, the table data structure has rows and columns. The columns are grouped into column families. Thus, each column family of a table includes one or more columns of the table. Contiguous sets of the rows are grouped to form "tablets." A tablet contains all the data in the table in a corresponding set of rows. The table 100 is sorted (at least conceptually) by row, sometimes called the row identifier. Thus, if the contents of the table were to be scanned from beginning to end, the contents would be accessed in row order. Existing tablets can be split to increase the number of tablets, or merged to reduce the number of tablets.

The column family is the basic unit for controlling accessing to data. Thus, if the administrator of a table wants to restrict access to the contents in a first set of columns, but to allow unrestricted or less restricted access to a second set of columns, the columns in the first set are assigned to a first column family while the columns in the second set of assigned to a second (i.e., different) column family. As described below, the metadata for the table includes separate sets of security parameters (sometimes called access control parameters) for each column family of the table. When a column family has no access restrictions, the security parameters may either be set to default values, or in some embodiments, those security parameters need not be stored in the table's metadata at all.

The tablet is the basic logical unit of storage for purposes of distributing portions of a table across a set of files. Tablets are logical units of storage, as opposed to physical units of storage, because the content of a tablet may be stored in multiple files. In fact, as described below, even a relatively simple tablet will be stored in more than file (at least temporarily) if the content of the tablet is updated. Tablets are sometimes herein called data sets.

In some embodiments, each row identifier is a string of arbitrary length and arbitrary value. Similarly, in some embodiments each column identifier is a string of arbitrary length and arbitrary value. In other words, in these embodiments, there are no length limitations and no (or few) value limitations placed on row and column names or identifiers. In some other embodiments, restrictions may be placed on the value of a row or column identifier. For example, the column identifier string may have to comply with a rule that disallows use of particular characters or symbols, or that requires the use of only printable characters or symbols. The rule may further disallow the use of a particular printable character, such as the colon character, except as a separator between first and second portions of the column identifier. In some embodiments, column names are segmented into a column family portion and a qualifier portion (sometimes called the column portion), separated by a predefined separator character or symbol. For example, a column name may have format such as cf1:c2, where the colon is the separator character. In these embodiments, the column family name and the qualifier portion of a column name can each be arbitrarily long and have arbitrary value; however the column family name may have to comply with a rule that disallows use of the predefined separator character in the column family name and/or in the qualifier portion of the column name.

Figure 2:
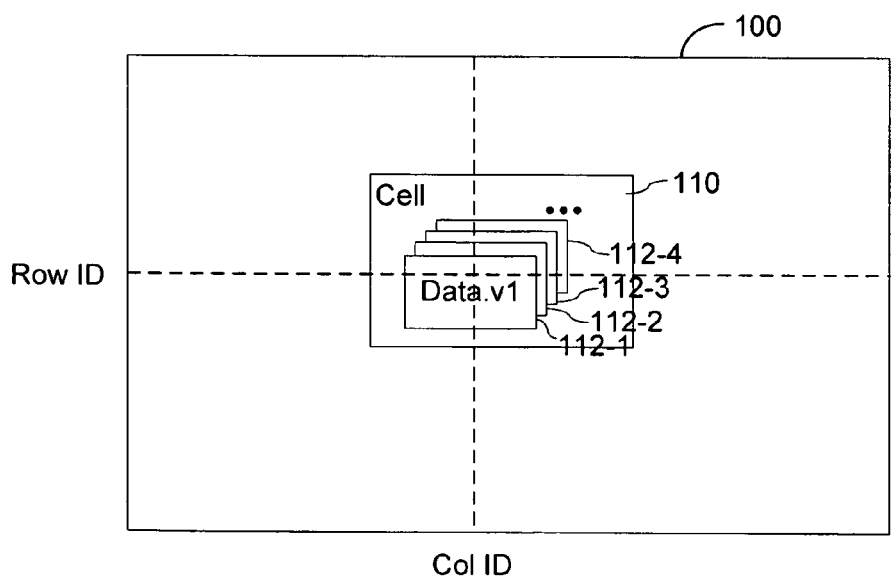
FIG. 2 is a conceptual block diagram illustrating storage of multiple versions of a data item in a single cell of a table.

As shown in FIG. 2, a cell 110 in a table 100 represents the junction of a specified row (Row ID) and column (Col ID). Furthermore, multiple versions 112 of a data item can be stored in a single cell of a table. Each version of the data is assigned either a version number or timestamp. In the remainder of this document, each data item is described as having an associated timestamp, but it is to be understood that the timestamp may be replaced by or treated as a version number.

Figure 3:
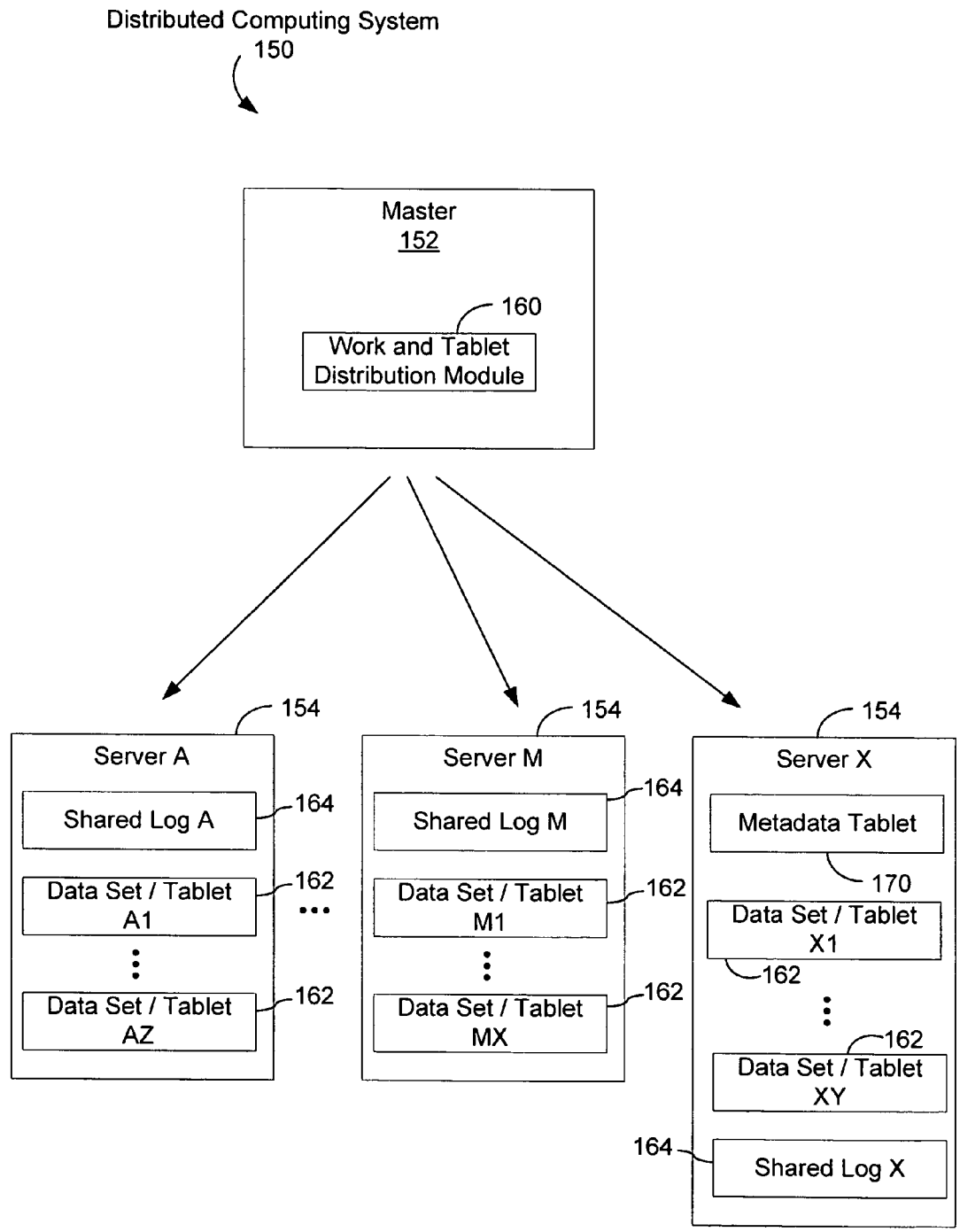
FIG. 3 is a block diagram illustrating a distributed system having a master and a plurality of data servers.

FIG. 3 is a block diagram illustrating a distributed computing system 150 having a master computer 152 and multiple servers 154, sometimes herein called data servers or tablet servers. The master computer 152 has a module 160 or programs for distributing tablets (table portions) among the servers 154. Each server 154 stores a plurality of tablets 162. The number of tablets may vary from one server to another. The master 152 may allocate tablets to servers based on load balancing criteria, resource availability, and other criteria. In some embodiments, a single system 150 (sometimes called a data center) includes hundreds or thousands of servers 154, and the number of tablets 162 stored in a single system may number in the thousands, hundreds of thousands or millions.

Each server 154 also has a shared log 164, which stores update records reflecting changes made to the tablets allocated to that server 154. The shared log 164 is stored as a sequence of files, each of which is automatically replicated by a distributed file system so that instances (sometimes called replicas or copies) of the file are stored on at least three distinct servers 154. Similarly, each of the files that stores the contents of the tablets is automatically replicated by the distributed file system so that instances (sometimes called replicas or copies) of the file are stored on at least three distinct servers. As a result, when a server 154 fails, all of the tablet files and log files of the failed server are available on other servers of the system. When recovering from a server failure, the master 152 reallocates all the tablets of the failed server to other servers 154, preferably distributing the load associated with those tablets across many servers.

Figure 4A:
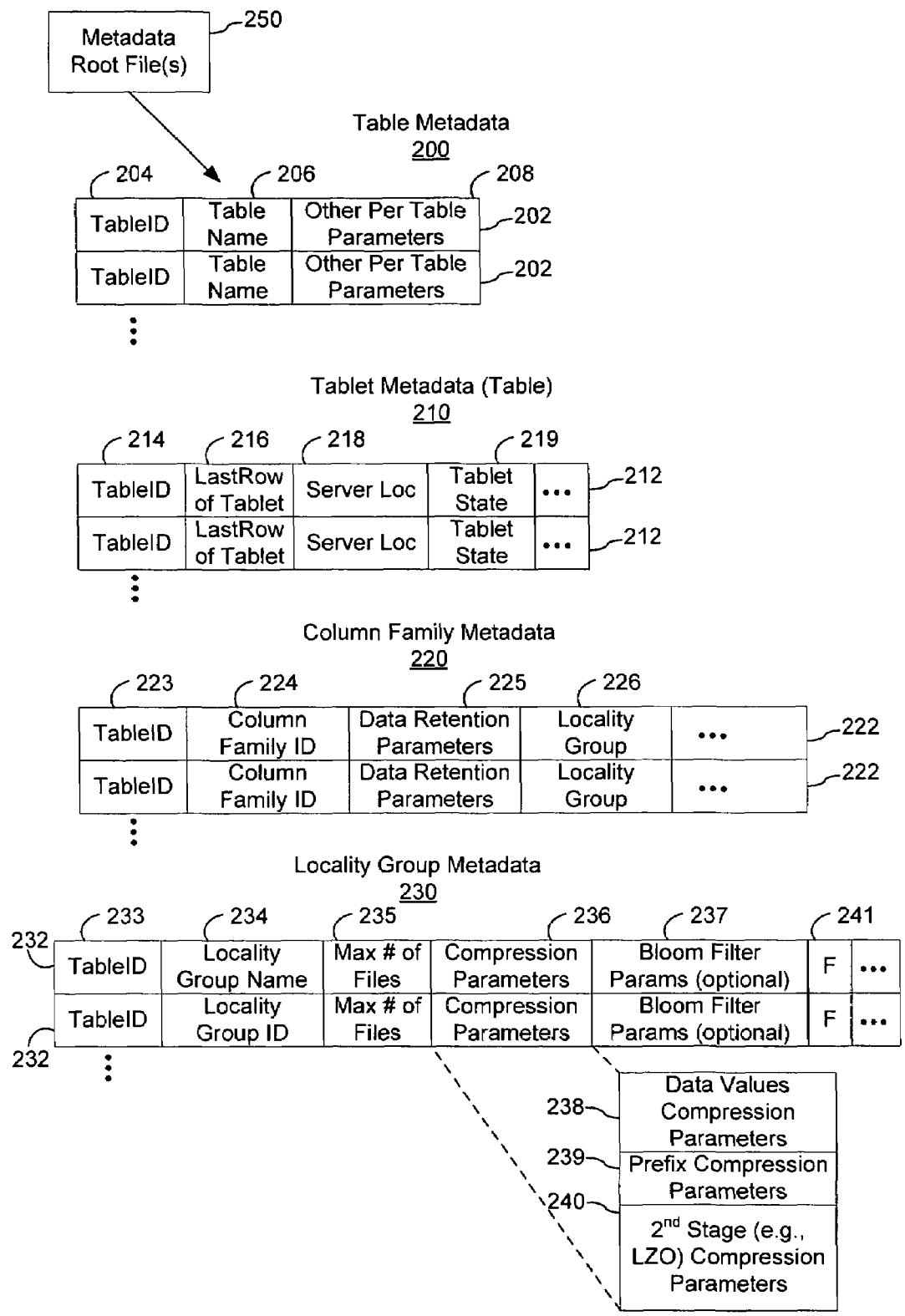
FIGS. 4A and 4B are block diagrams of data structures for storing metadata associated with a set of tables.
Figure 4B:
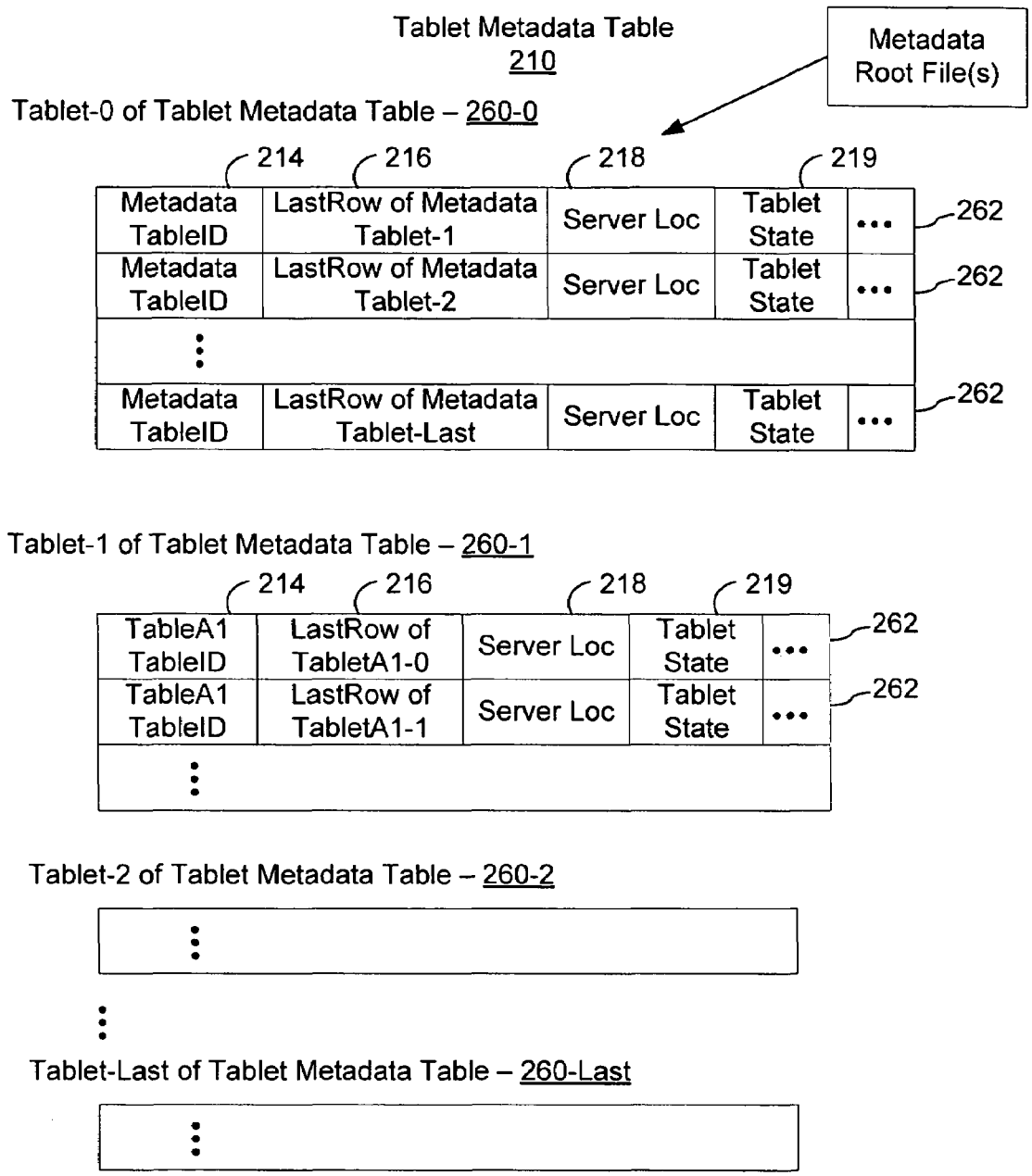

FIGS. 4A and 4B are block diagrams of data structures for storing metadata associated with a set of tables. These figures show four sets of metadata: table metadata 200 (sometimes called per table metadata), tablet metadata 210 (per tablet metadata), column family metadata 220 and locality group metadata 230. One or more metadata root files 250 may be used to store the location of the metadata tables, tablets or files, and thus to bootstrap the system when recovering from a power failure or the like. Some of the metadata sets, such as the table metadata 200 and the column family metadata 220, are sufficiently small that they may be stored in a small number of files having predefined names. At least one of the metadata sets, namely the tablet metadata 210, is sufficiently voluminous in some embodiments that this metadata is itself stored in a table data structure, which in turn has many tablets. In some embodiments, the tablet metadata table 210 contains thousands, hundreds of thousands or millions of entries 212, each of which indicates the location of a distinct respective tablet in the data center (or distributed computer system) 150.

In some embodiments the table metadata 200 includes a record 202 for each distinct table stored in a single data center 150 (i.e., the distributed system of FIG. 3). Each table metadata record 202 may include a table identifier 204, a name of the table 206, and optionally may include other per table parameters 208 (e.g., the identifier of an administrator or creator of the table).

In some embodiments, the tablet metadata 210 includes a record 212 for each distinct tablet stored in a single data center 150. Each tablet metadata record 212 may include a table identifier 214, the name of the last row of the tablet 216, an identifier or location 218 of the server to which the tablet is assigned (i.e., the server which handles access to and updates to the tablet), and a set of information 219 representing the state of the tablet. In some embodiments, tablet state information 219 includes a list of the files (see files 300, 302, FIG. 5) that store the content of the tablet, a list of the sub-log files 320, 322 (FIG. 5) that would be needed to recover the state of the tablet in a failover, and a log position indicating the position of the first update record in the shared log 164 to be used for recovering the state of the tablet in a failover. The tablet metadata records 212 may optionally include additional fields. The combination of the table identifier 214 and last row name or identifier 216 may be considered to be the key of the tablet metadata table 210, because all the tablet metadata records 212 are ordered within the tablet metadata table 210 in accordance with the table identifier concatenated with the last row name or identifier. In some other embodiments, each tablet metadata record may include the table identifier and the name of the first row of the next tablet in the table as the key of tablet metadata table. If a tablet is the last tablet of a table, a predefined "infinity" designation may be used in place of the name of the (non-existent) first row in the next tablet in the table.

The range of rows included in any particular tablet is specified by the last row name or identifiers in two tablet metadata records 212: the record 212 of the particular tablet and the immediately preceding record 212 in the tablet metadata table. If the immediately preceding record 212 in the tablet metadata table has a different table identifier, then the current tablet is the first tablet of its table.

To locate the tablet that stores a specified row of a table, the tablet metadata 210 is searched or scanned until the first tablet metadata record is found that (A) has the same table identifier as the tablet and (B) has a last row that is equal (i.e., has the same value or sort value) or greater (i.e., has a higher value, or sort value) than the specified row. This record identifies the tablet that stores the specified row, and the server location 218 specified by the record identifies the server which handles access to the identified tablet. In the embodiments where the tablet key is the table identifier and the name of the first row of the next tablet of the table, the record identifying the tablet that stores a specified row of a table is located by scanning the tablet metadata until the first tablet metadata record is found that (A) has the same table identifier as the tablet and (B) has a first row (of the next tablet) name that is greater (i.e., has a higher value, or sort value) than the specified row.

In some embodiments, the servers 154 and the master 152 of the data center may each maintain a cache of recently accessed tablet-to-location mappings. This may speed up the process of locating tablets by having locations for frequently accessed tablets more readily available.

As shown in FIG. 4B, in a first tablet 260-0 of the tablet metadata table 210 all the entries 262 have table identifiers 214 equal to the predefined identifier of the tablet metadata table. In addition, the last row field 216 of each entry 262 of the first tablet 260-0 matches the concatenation of the table identifier 214 and the last row 216 of a last entry 262 in another respective one of the tablets 260 (e.g., tablet 260-1) of the tablet metadata table 210. The server that hosts the first tablet 260-0 of the tablet metadata table 210 is identified by a metadata root file 250, which has a predefined file name and can therefore be located whenever the distributed computer system 150 is restarted. Thus, to retrieve a value having a specified key in a specified table, the process is as follows. This description assumes the tablet locations haven't been cached. The first tablet 260-0 of the tablet metadata is searched to identify and locate the tablet metadata tablet for the specified table. Then the identified tablet metadata tablet is searched to locate the entry for the specified key, which identifies the tablet containing the specified key-value pair and also identifies the server that hosts the tablet. Finally, the process continues at the hosting server, by searching the identified tablet to locate the value at the specified key. For many data access operations, one or both metadata entries in the tablet metadata will have been cached, making the access process even more efficient.

Referring again to FIG. 4A, in some embodiments, the column family metadata 220 includes a record 222 for each column family of each distinct table stored in a single data center 150. Each column family metadata record 222 may include a table identifier 223, the name or identifier 223 of the column family 216, a set of data retention parameters 225, and the name or identifier of the locality group 226 to which the column family is assigned. Column family metadata records 222 may optionally include additional fields. In some embodiments, the column family metadata 220 is stored on a per-table basis and may be stored together with the table metadata 200 and the locality group metadata 230. In these embodiments, the table metadata 200, column family metadata 220 and locality group metadata 230 for each distinct table are stored together in a corresponding metadata file.

In some embodiments, the data retention parameters 225 can include a parameter that specifies a maximum number of data items to be retained in each cell of the column family. Alternately stated, when a non-zero value maximum number is provided, and the data items stored in a cell exceed the specified maximum number, the oldest data items in the cell (as indicated by the timestamps or versions numbers of the data items) can be deleted or garbage collected until the number of items in the cell is reduced to the specified maximum number. The garbage collection of excess data items need not occur immediately, and thus may be performed at scheduled times or whenever the load on the server falls below a predefined level.

In some embodiments, the data retention parameters 225 can include a parameter that specifies a maximum age (also called an age limit) of data items to be retained in each cell of the column family. Alternately stated, when a non-zero value maximum age is provided, and any of the data items stored in a cell have an age (as indicated by the timestamps of the data items) that exceeds the specified maximum age, those data items in the cell can be deleted or garbage collected. The garbage collection of data items whose age is greater than the specified age limit need not occur immediately, and thus may be performed at scheduled times or whenever the load on the server falls below a predefined level.

In some embodiments, the data retention parameters 225 can include a first parameter that specifies a maximum age and a second parameter that specifies a maximum number of data items per cell in the column family.

In some embodiments, the column family metadata may include security parameters 227 to govern access to data in any of the columns in the column family. For instance, these parameters may restrict access so that ordinary users have only read access to the data in the columns of the column family, while other classes of users, such as those with administrator rights, have both read and write access. The access rights for one column family in a table may differ from the access rights for another column family in the same table.

In some embodiments, the locality group metadata 230 includes a record 232 for each locality group of each distinct table stored in a single data center 150. Each locality group metadata record 232 may include a table identifier 233, the name or identifier 234 of a respective locality group, a field 235 indicating the maximum number of files used to store the locality group, and a set of compression parameters 236. The locality group metadata records 232 may optionally include a set of Bloom filter parameters 237, and may optionally include additional fields, such as a location flag 241. In some embodiments, the compression parameters 236 include one set of compression parameters 238 for compressing the data values in a locality group, another set of compression parameters 239 for compressing the key values in a locality group, and yet another set of compression parameters 240 for performing a secondary compression of the result produced by compressing the data values and keys. In some embodiments, a key value may include a string of four values such as r.cf.c.ts, where "r" represents a row identifier, "cf" represents a column family name or identifier, "c" represents a column name or identifier and "ts" represent a timestamp or version number or version identifier. As described in more detail below, the values in a table data structure may be stored as key-value pairs, where each key identifies the location of the value in the table, as well as the timestamp or version number of the corresponding value. Every key in a table, tablet or locality group is unique with respect to all the other keys in the same table, tablet or locality group. In some embodiments, the locality group metadata 230 is stored on a per-table basis and may be stored together with the table metadata 200 and the column family metadata 220. In these embodiments, the table metadata 200, column family metadata 220 and locality group metadata 230 for each distinct table are stored together in a corresponding metadata file.

The optional Bloom filter parameters 237 are provided when a Bloom filter is used to block attempts to access nonexistent entries in the locality group. In some embodiments, when Bloom filters are used with a locality group, the Bloom filters are stored in each of the files used to the store the locality group (i.e., each file includes its own Bloom filter). Every time an item is added to the locality group, within a particular tablet, the key of the item is hashed and used to update the Bloom filter. Whenever an attempt is made to read the item corresponding to a specified key, the Bloom filter is checked to see if the locality group, within the particular tablet, contains or may contain the item. If the Bloom filter returns a negative result, the item is known to not be present in the locality group of the particular tablet, while if the Bloom filter returns a positive result, a value corresponding to the key is likely (but less than 100 percent certain) to be found in the locality group of the particular tablet. The Bloom filter parameters 237 may specify which of the locality group's files have Bloom filters. In some embodiments, the Bloom filter parameters 237 may also specify the number of hash functions to be used and/or the size of the Bloom filter array, while in other embodiments the number of hash functions and the size of the Bloom filter array are automatically determined.

The location flag 241 may be set or reset by a user to designate a locality group for loading into and keeping in volatile memory. For example, if the flag 241 for a locality group is set, then the locality group files corresponding to that locality group are loaded into volatile memory and kept in the volatile memory until the flag is cleared. If the flag 241 is cleared, then the locality group files corresponding to that locality group are not kept in volatile memory. Keeping locality group files in volatile memory may help speed up operations that access the files. It should be appreciated that the shared log is not affected by the state of the location flag.

Figures 5A, 5B:
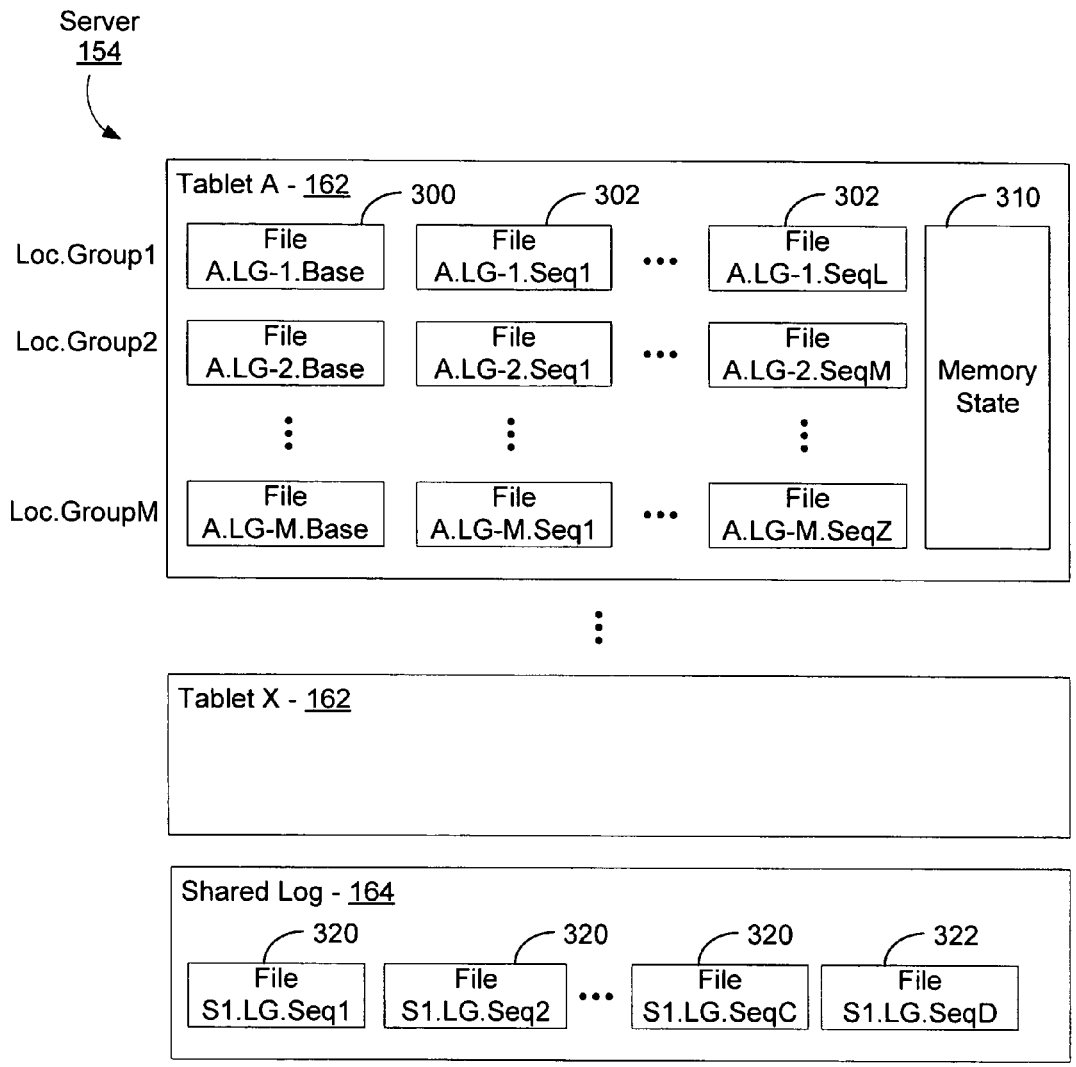

FIG. 5A is a block diagram of the files used by one server to store tablets 162 and updates to the tablets. As shown, for each locality group in a tablet 162, there is a main or base file 300, and a set of one or more update files 302. In addition, updates to the locality group of the tablet 162 since the last time an update file 302 was produced are stored in a memory state array 310, which is stored in the main memory of the server hosting the tablet 162. As shown in FIG. 5B, each of the locality group files 300, 302 and the memory state 310 contains sets of key-value pairs. In some embodiments, the key value pairs of each locality group file are stored in key sorted order (i.e., starting at a lowest key value in the file and progressing monotonically to the highest key value in the file, or vice versa) along with an index on the keys for fast access. Since the update files 302 of a locality group are created after the creation of the base file 300, the update files 302 may contain new values for some of the same keys found in the base file.

Whenever a compaction trigger event occurs (e.g., episodically, when the memory of a server reaches a predefined level of fullness, or the memory state array 310 reaches a predefined size or level of fullness; periodically, when the passage of a time since a last compaction reaches a predefined threshold; upon a split or merge of a tablet; upon the unloading of a tablet; and/or upon user request), the update information in the memory state array 310 is used to generate new update files 302 for the locality groups for which the memory state array 310 contains updates. If, as a result, the number of files for a locality group exceeds the maximum number of files allowed for that locality group (as specified by either the metadata for the locality group, or by a default value), then two or more of the update files 302 are combined so as to reduce the number of update files 302. In an alternate embodiment, when the number of update files 302 is already at its maximum allowed value for a locality group, the update information in the memory state 310 is added to the newest of the update files.

When performing a "compaction," which means combining two or more locality group files 300, 302, if the same key is found in two files 300, 302, then the newer value for the key is retained and the older value is discarded. If the newer "value" is a deletion, all older values for the key are discarded if the compaction compacts to the base file. If the compaction does not compact to the base file, the deletion "value" is retained.

In some embodiments, a compaction trigger event may trigger either a minor compaction or a major compaction. For example, a minor compaction is triggered when a server's memory reaches a predefined level of fullness. Memory fullness may be based, for example, on the total amount of data stored in the memory state arrays 310 for all the tablets hosted by the server. When a minor compaction is triggered, the server identifies one or more tablets whose memory state arrays have the most data in them, and then writes the information from each of those memory state arrays 310 into one or more locality group files 302. The memory state array 310 is then re-initialized to a predefined empty state. In some embodiments, the minor compaction is performed on successive tablets until the fullness of the server's memory falls below a predefined threshold level of fullness. In other embodiments, each minor compaction trigger event causes only one tablet's memory state array 310 to be converted into one or more locality group files 302. The tablet whose memory state array 310 is converted is selected based on the amount of data stored in the memory state arrays 310 of the tablets hosted by the server, or on a round robin ordering of minor compactions, or on any other appropriate selection mechanism or rule. As noted above, a minor compaction may also include merging locality group files 302 when the number of locality group files for any particular locality group exceeds the maximum number of such locality group files specified for that locality group.

A major compaction is the combining of the base file 300 and all the update files 302 of a locality group so as to form a new base file 300. In some embodiments, a major compaction is triggered periodically, for instance once per day. In these embodiments, a compaction thread is launched upon the triggering of a major compaction. The compaction thread performs a major compaction on the locality files of each tablet, one locality group at a time, within one tablet at a time, until the sets of locality group files of all the tablets hosted by the server have been compacted to form new locality group base files 300. In some other embodiments, major compactions are performed on the locality groups of a tablet, one at a time, in round robin order during successive compaction events. Periodically compacting all the locality group files 300, 302 of each locality group into new base files helps to keep access to the data in the tablets efficient and ensures that deleted data are eventually removed from the system.

In an alternate embodiment, the server 154 includes a separate memory state array 310 for each locality group of each tablet hosted by the server 154.

Each tablet or data server includes a shared log 164. Whenever an update is made to a tablet hosted by the server 164, the update is first committed to the shared log 164, and only when the update is know to be committed to the shared log 164 is the update applied to the memory state array 310. The shared log 164 is stored as a sequence of sub-log files 320. In some embodiments, new updates are added to a current sub-log file 322 until the sub-log file reaches a threshold size, or until a new addition to the current sub-log file 322 would cause the size of the sub-log file to exceed a threshold value. At that point, the current sub-log file is closed and a new sub-log file is created and becomes the current sub-log file to which new updates are added.

The shared log 164 stores a sequence of update records. Each update record indicates a new value for a specified key; the deletion of the value (if any) at a specified key; the deletion of a cell at a specified row and column; or the deletion of an entire row. In some embodiments, a single update record may indicate the deletion of a subset of multiple versions of data values at a cell.

In some embodiments, the tablets, column families, and locality groups are non-overlapping. This means that that a row cannot belong to two tablets at the same time and a column cannot be assigned to two column families or two locality groups at the same time; the ranges of rows between tablets are mutually exclusive and the ranges of columns between column families or between locality groups are mutually exclusive. For example, if a table has rows A, B, C, D, E, the table has two tablets, and a first tablet of the table contains rows A, B, C; then the second tablet contains rows D, E and cannot contain rows A, B, or C because rows A, B, C already belong to the first tablet. As another example, if a table has columns P, Q, R, S, T, the table has two column families, and a first column family of the table contains columns P, Q, R; then the second column family contains columns S, T and cannot contain columns P, Q, or R because columns P, Q, R are already assigned to the first column family.

Figure 6:
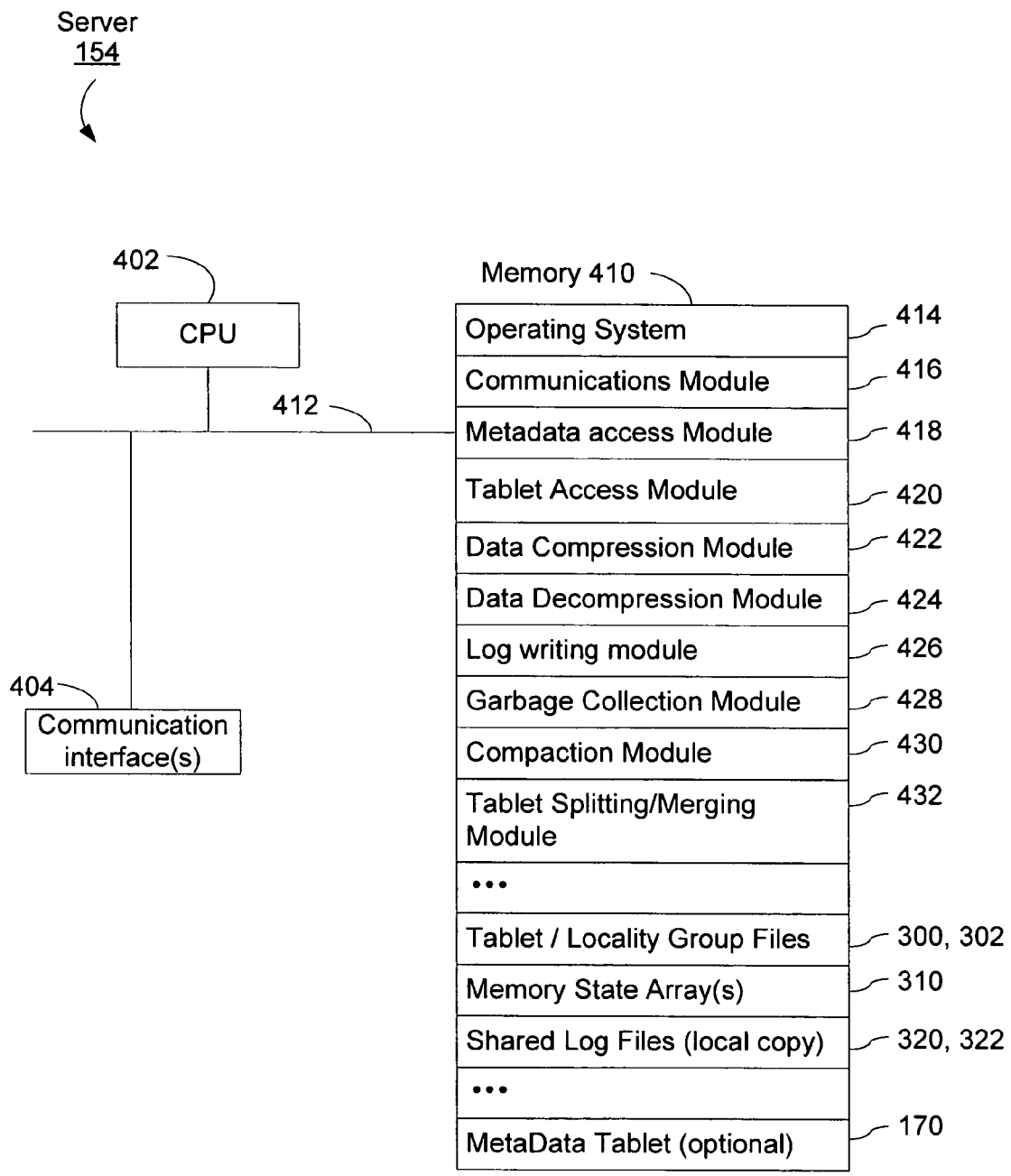
FIG. 6 is a block diagram of a computer, such as a server (sometimes called a data server or tablet server), that participates in a distributed system in which data is stored in a set of tables, portions of which are stored and maintained across a number of interconnected servers.

In some embodiments, a data or tablet server 154, as shown in FIG. 6, includes one or more processing units (CPU's) 402, one or more network or other communications interfaces 404, memory 410, and one or more communication buses 412 for interconnecting these components. Memory 410 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 410 may optionally include one or more storage devices remotely located from the CPU(s) 402. In some embodiments, the memory 410 stores the following programs, modules and data structures, or a subset thereof:

- an operating system 414 that includes procedures for handling various basic system services and for performing hardware dependent tasks;
- a network communication module 416 that is used for connecting the server 154 to other computers via the one or more communication network interfaces 404 and one or more communication networks, such as a local area network, the Internet, other wide area networks, metropolitan area networks, and so on;
- a metadata access module 418 for accessing the metadata for any specified table, tablet, column family or locality group;
- a tablet access module 420, for accessing (i.e., reading and/or writing) data in a specified tablet at a specified row and column of a specified table;
- a data compression module 422 for compressing files; the data compression module 422 may perform data compression of locality group files 300, 302 in accordance with the compression parameters 236 specified for the corresponding locality groups;
- a data decompression module 424 for decompressing compressed files;
- a log writing module 426, for writing update records to a log file, such as the shared log files 320, 322 described above;
- a garbage collection module 428 for garbage collecting (i.e., deleting) data that exceeds in number or age the data retention rule or parameters specified for a column family;
- a compaction module 430, for compacting or combining locality group files 300, 302, as described above; and
- a tablet splitting/merging module 432, for splitting tablets to increase the number of tablets or merging tablets to decrease the number of tablets.

As described elsewhere in this document, memory 410 of a data or tablet server may also store a number of files and data structures, including tablet files (i.e., locality group files 300, 302), one or more memory state arrays 310, and shared log files 320, 322. Optionally, memory 410 may also store one or more metadata tablets 170, each of which may include one or more sets of locality group files.

Each of the above identified elements of FIG. 6 may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 410 may store a subset of the modules and data structures identified above. Furthermore, memory 410 may store additional modules and data structures not described above.

Although FIG. 6 shows a data or tablet server, FIG. 6 is intended more as functional description of the various features which may be present in a data or tablet server, or set of such servers, than as a structural schematic of the embodiments described herein. In practice, and as recognized by those of ordinary skill in the art, items shown separately could be combined and some items could be separated. For example, some items shown separately in FIG. 6 could be implemented on single servers and single items could be implemented by one or more servers.

Data Compression

Figure 7:
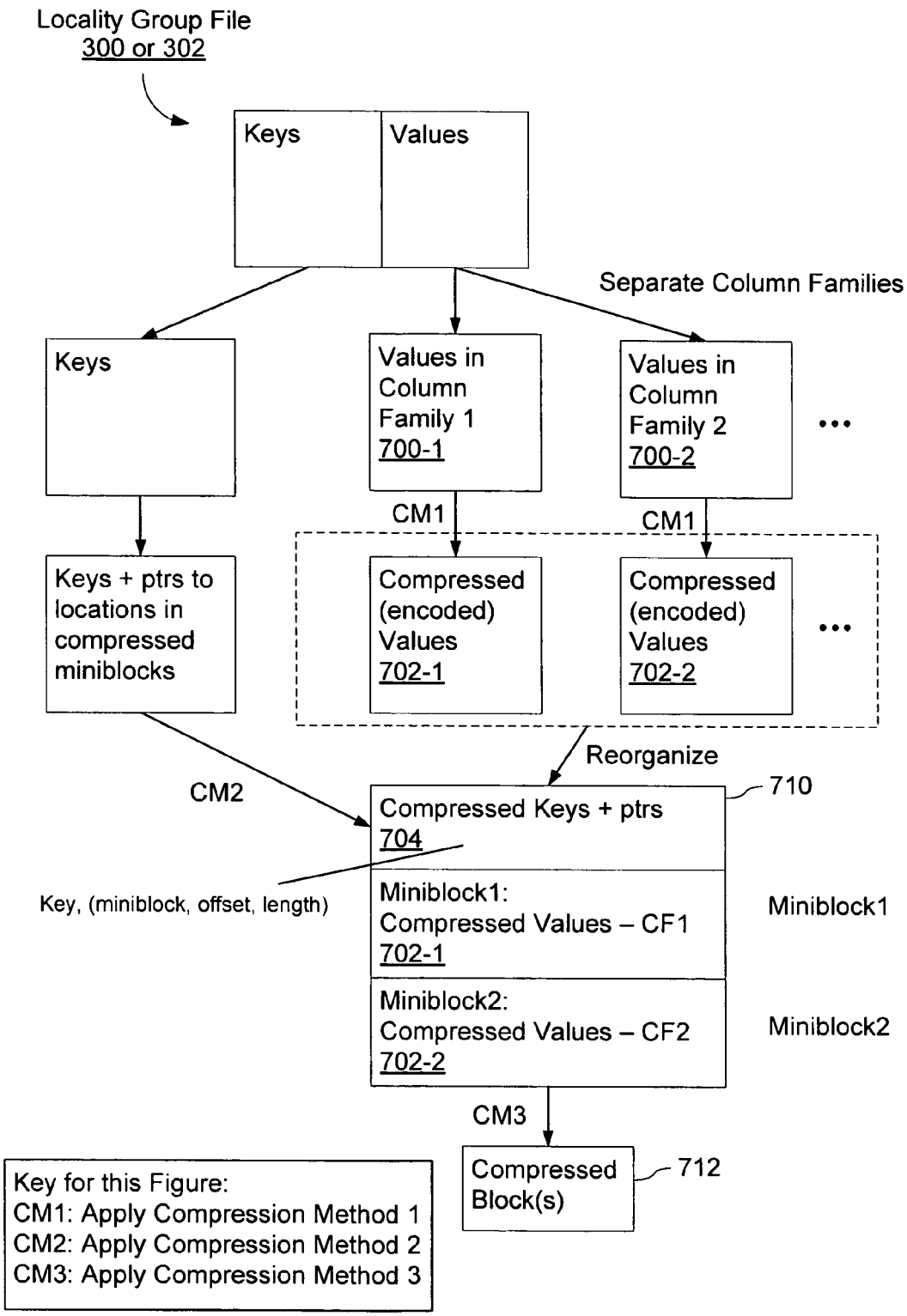
FIG. 7 is a conceptual flow chart of a data compression method for compressing a locality group file.

FIG. 7 is a conceptual representation of a process of compressing a locality group file 300 or 302 for a particular tablet. As shown, the file contains keys and values, as discussed above. The keys and their values are stored in key order. If the locality group file contains data for more than one column family, the values for the column families are separated into separate arrays or blocks 700. The values for each column family are compressed separately, using a first dictionary based compression method (CM1), to produce separate "miniblocks" 702 of encoded values. More generally, the compression process may segregate values into groups of values that are deemed likely to compress well together, and may keep apart values that are deemed likely not to compress well together. For instance, values could be segregated by data type.

As each value in a block 700 is compressed, a link is added to the corresponding key, which links the key to the encoded value in the encoded miniblock 702. For example, the link may indicate the number or identifier of the miniblock 702, a starting position in the miniblock, and a length or final position in the miniblock.

Optionally, the keys may be encoded so as to reduce the amount of space required to store the keys and their associated links. For instance, the keys can be encoded using delta encoding or prefix encoding. The method of encoding of the keys is sometimes herein called a compression method. As just indicated, in some embodiments the compression method (CM2) used to compress the keys is not a dictionary based compression method, and is instead a delta or prefix compression. However, in some embodiments, the keys are not encoded or compressed at this stage of the data compression process.

Next the keys and links 704 (whether compressed or not) and the encoded miniblocks 702, are concatenated to form a single block 710, and then the entire block 710 is compressed using a second dictionary based compression method (labeled CM3 in FIG. 7) to form a compressed block 712. In some embodiments, the second dictionary based compression method is the LZW (Lempel-Ziv-Welch) compression method, or any other compression method that uses a fixed size dictionary.

The first dictionary based compression method (CM1) utilizes a first dictionary of unlimited size and a search window that includes all values of the data set previously encoded by the compression method. The second dictionary based compression utilizes a second dictionary of limited size (e.g., 1024 or 16,384 entries). Furthermore, each dictionary entry of the second dictionary is associated with a smaller quantity of input data (e.g., four bytes) than the each dictionary entry of the first dictionary (e.g., 32 bytes per dictionary entry).

In some embodiments, the first dictionary based compression utilizes the Bentley-McIlroy data compression method or a compression method similar to the Bentley-McIlroy data compression method. The Bentley-McIlroy data compression method is described in Jon Bentley and Douglas McIlroy, "Data compression using long common strings," Proceedings of the IEEE Data Compression Conference, Mar. 1999, pp. 287-295, which is hereby incorporated by reference. Two embodiments of the first dictionary based compression method are described in detail below with reference to FIGS. 9, 10A, 10B, 11, 12A and 12B.

Figure 8:
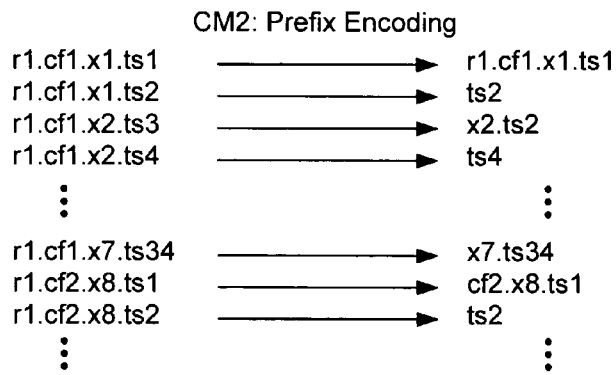
FIG. 8 depicts prefix encoding of an ordered set of keys.

FIG. 8 shows, on the left, an ordered set of keys. On the right are shown prefix encoded versions of the keys. Effectively, each key is represented by the difference from the preceding key. While the example in FIG. 8 shows prefix encoding at a "subfield" level, prefix encoding can be implemented at the byte or symbol level. For example, a sequence of two values, abc. 1234 and abc. 1222, can be prefix encoded as abc. 1234 and 22. In some embodiments, especially for large data sets having thousands of keys, the ordered set of keys are divided into groups of non-overlapping contiguous subsets of the keys. The first key in each group may correspond to an index entry for the encoded file or block. In any case, the first key in each group is represented by the full key while the following keys are prefix or delta encoded. In this way, decoding of keys in middle or end of the set of keys requires decoding at most N keys, where N is the maximum number of keys in each group.

First Embodiment of First Dictionary-Based Compression Process

Figure 9:
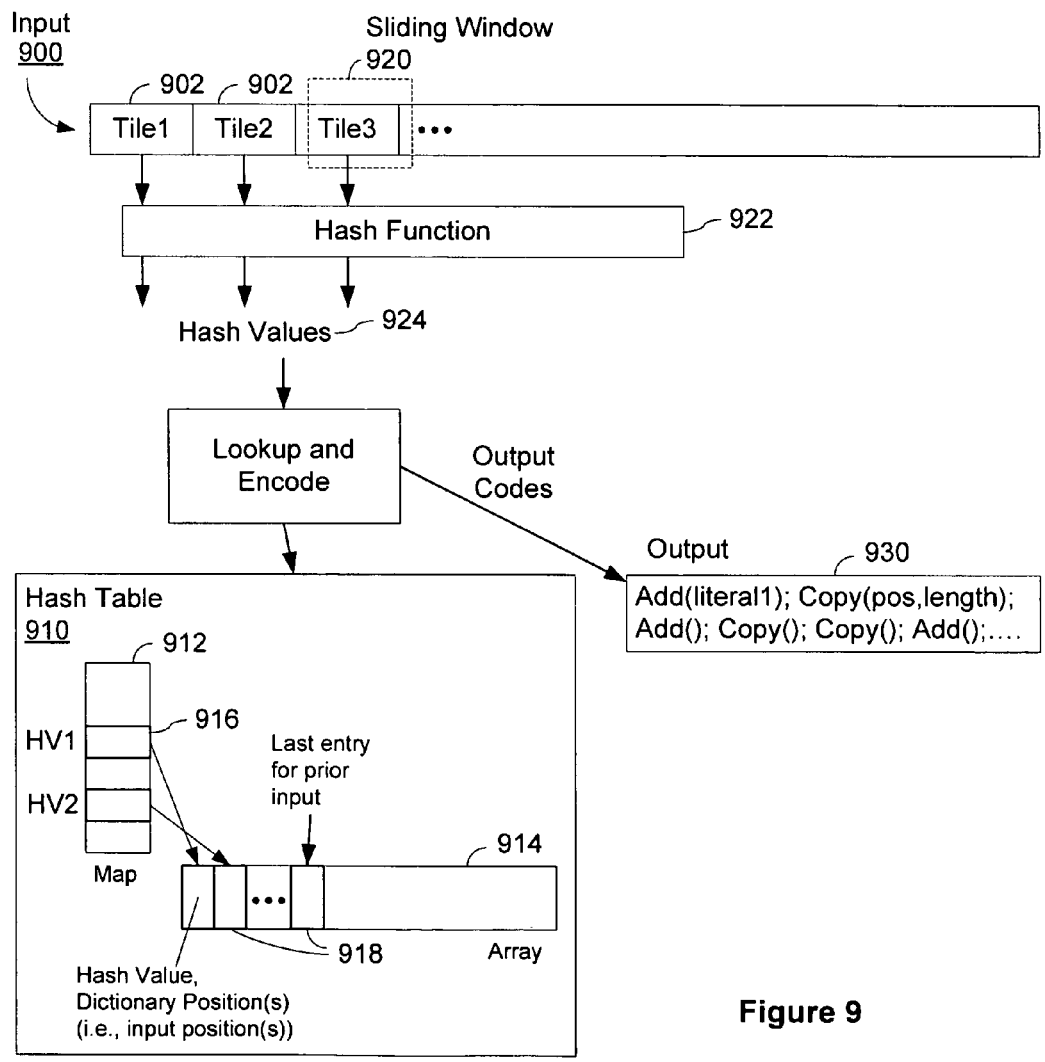
FIG. 9 is a conceptual block diagram of the Bentley-McIlroy data compression method.

FIG. 9 is a conceptual representation of the Bentley-McIlroy data compression method or process. The process compresses an input string 900, which is treated as a string of literal data values (e.g., a string of bytes or words, each of which can have any value). The base unit of information in the input string 900 may be a byte or a word of any suitable size, such as 4 bytes. In this example, the input is divided into tiles 902, and each tile is represented by an entry in a hash table 910. In this process, the input string 900 is considered to be the "dictionary" for the compression method, and the hash table is used to quickly find common strings in the input. For purposes of explaining the data compression process, we will assume the input string 900 includes multiple versions of the same web page, at least some of which contain large portions that are identical to other versions of the web page. If each version of the web page occupies thousand bytes of storage (e.g., 25,000 bytes), at least some of the matching common strings in the input string will be separated by distances of thousands of bytes.

In some embodiments, the tiles 902 are 32-bytes long and do not overlap. In other embodiments, the tiles may be other sizes. Increasing the tile size reduces the chances of finding matches in small matching strings (strings of size less than twice the tile size), but decreases the number of hash table entries and decreases processing time.

The hash table 910 includes a map 912 and an array 914. Each entry 916 in the map 912 points to an entry 918 in the array 914. The map entries 916 are located at positions in the map 912 based on the hash value of the tile being added to the hash table 910. Array entries 918 are added sequentially to the array 914, so the location of last entry in the array 914 is known to the procedures used to access the hash table.

The input string 900 is processed from the beginning to the end, by sliding a virtual window 920 over the input string 900 and processing the input string at each position of the virtual window. The virtual window 920 is moved in predefined increments or units, such as one byte or one word. The window 920 has the same size (e.g., 32 bytes) as the tiles 902. Each time the virtual window 920 is moved, the input string portion in the window is mapped by a hash function 922 into a hash value 924. The hash value 924 has a predefined size, such as 32 bits. A lookup is performed on the hash value 914 to see if matching entry is found in the hash table. If so, a copy code is added to the output string 930. If the hash value 924 is not found in the hash table, the literal value at the beginning of the window is added to an "Add String".

When the virtual window 920 completely overlaps a tile, the hash table is updated to include either a new entry, or by updating an existing entry. If the map 912 does not include an entry 916 corresponding to the hash value of the current input sub-string (i.e., the portion of the input string in the virtual window 920), an entry 918 is added to the array and an entry 916 is added to the map that points to the new array entry 918. The array entry 918 stores the hash value, and a reference to the location of the input sub-string in the input string 900, which is also the current position of the virtual window 920. If the hash table already has an entry for the hash value of the current input sub-string, then that entry may be updated by adding a reference to the current position of the virtual window 920. In some embodiments, the number of input string positions indicated by any one hash table entry 916 is limited to a predefined number (e.g., 4, 8, 16 or 32), and a predefined rule is applied to determine which input string positions to keep in an entry and which to discard or not record.

The output string 930 contains a sequence of Add codes and Copy codes. Each Add code includes a sequence of one or more literal data values. Each Copy code specifies a range of locations in the input string that are to be duplicated or copied to produce a decoded portion of the input string 900. The Copy code may include a start position within the input string and a length, or it may indicate start and end positions. During decoding, the output string 930 of the compression process becomes the input string to the decoding process. Add codes are executed or decoded simply by adding the literal data values in the add code to a decoded output string. Copy codes are executed by copying the specified range of values from the decoded output string to the current endpoint of the decoded output string. Thus, during decoding, while decoding any copy code in the encoded data, the "dictionary" is the decoded version of all the add and Copy codes preceding the Copy code currently being decoded.

Second Embodiment of First Dictionary-Based Compression Process

Figure 10A:
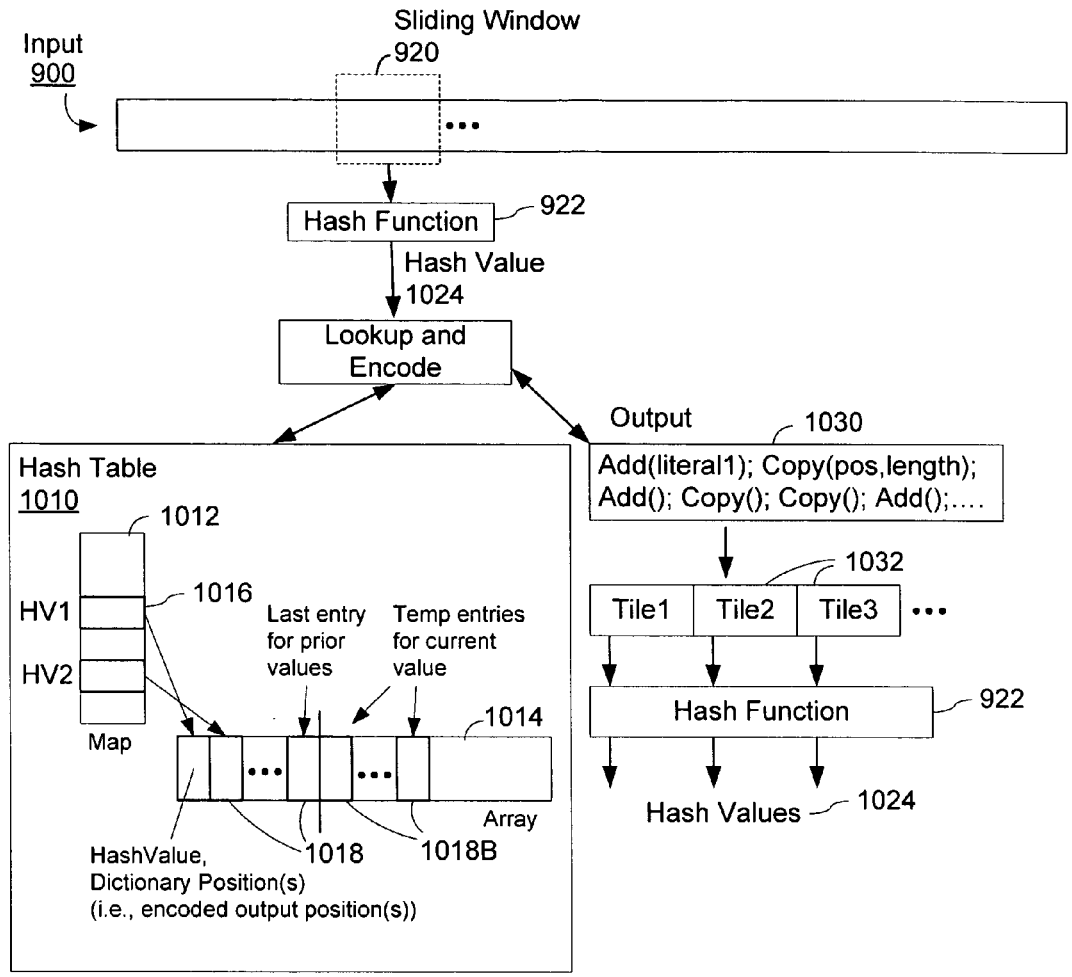
FIGS. 10A and 10B are conceptual block diagrams of a modified version of the Bentley-McIlroy data compression method, the output from which can be decoded without generating a hash table or dictionary.
Figure 10B:
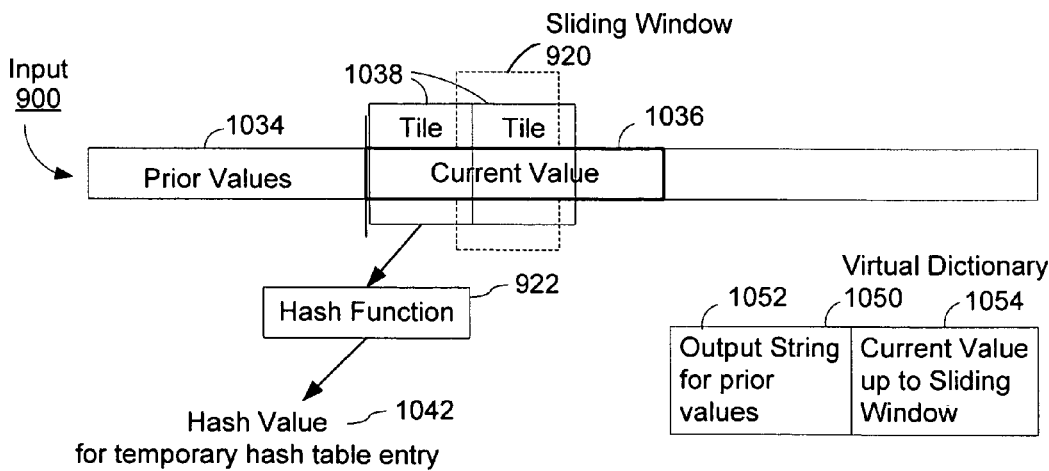

FIGS. 10A and 10B are a conceptual representation of another dictionary-based compression process that is somewhat similar to the Bentley-McIlroy data compression method or process. While similar data structures and processes are used, the content of the hash table 1010, the output string 1030 and the state of the "dictionary" are different.

As before, the process compresses an input string 900, which is treated as a string of literal data values. Further, the input string 900 is treated as a sequence of values, each of which corresponds to a key in the data set and is a string of literal data values. In this process, the output string 1030 is tiled, and tiles 1032 of the output string 1030 are hashed by the hash function 922 to produce the hash values 1024 that are stored in a hash table 1010. In some embodiments, the tiles 1032 of the output string 1030 are 32-bytes long and do not overlap. In other embodiments, the tiles may be other sizes.

In this data compression process, the dictionary used by the compression process is a virtual dictionary 1050, shown in FIG. 10B, formed by concatenating the output string 1052 for all prior values in the input string, and the portion of the current value 1054 ending at the current position of the sliding window.

The hash table 1010 includes a map 1012 and an array 1014. Each entry 1016 in the map 1012 points to an entry 1018 in the array 1014. The map entries 1016 are located at positions in the map 1012 based on the hash value of the tile being added to the hash table 1010. Array entries 1018 are added sequentially to the array 1014, so the location of last entry in the array 1014 is known to the procedures used to access the hash table.

The input string 900 is processed from the beginning to the end, by sliding a virtual window 920 over the input string 900 and processing the input string at each position of the virtual window. The window 900 is moved in predefined increments or units, such as one byte or one word. The window has the same size (e.g., 32 bytes) as the tiles 1032. Each time the virtual window 920 is moved, the input string portion in the window is mapped by a hash function 922 into a hash value 1024. The hash value 1024 has a predefined size, such as 32 bits. A lookup is performed on the hash value 1024 to see if matching entry is found in the hash table 1010. If so, a Copy code is added to the output string 1030. If the hash value 1024 is not found in the hash table 1010, the literal value at the beginning of the window is added to an "Add String".

Whenever all the output codes (i.e., a sequence of one or more Add codes and/or Copy codes) for a value have been added to the output string 1030, any new tiles 1032 in the output string 1030 are hashed by the hash function 922 to produce hash values 1024. The hash table 1010 is updated to include either a new entry, or by updating an existing entry. If the map 1012 does not include an entry 1016 corresponding to the hash value of a tile 1032 in the output string, an entry 1018 is added to the array and an entry 1016 is added to the map that points to the new array entry 1018. The array entry 1018 stores the hash value, and a reference to the location of the tile 1032 in the output string 1030. If the hash table 1010 already has an entry for the hash value 1024 of the current tile 1032, then that entry may be updated by adding a reference to the position of current tile 1032. In some embodiments, the number of positions indicated by any one array entry 1018 is limited to a predefined number (e.g., 4, 8, 16 or 32), and a predefined rule is applied to determine which input string positions to keep in an entry and which to discard or not record.

While processing a value in the input string, some of which can be very long, the current input value is tiled and temporary entries are added to the hash table 1010 for those tiles 1038. As shown in FIG. 10B, the tiles 1038 of the current input value are hashed by hash function 922 to produce hash values 1042. Referring to FIG. 10A, array entries 1018B are temporary entries created for the tiles 1038 of the current input value. These temporary entries are located in the array 1014 after the last hash table array entry for the prior encoded values, and they are deleted from the hash table 1010 when compression of the current input value is completed. Thus, while scanning the sliding window over the current input value in the input string, these additional hash table entries are used to find common strings within the current input value.

Copy codes produced as the result of matches with temporary entries 1018 in the hash table reference a range of locations in the virtual dictionary 1050 that are after the last location associated with the output string for prior values 1052. During decompression these copy codes are recognized and are decoded by referencing the portion 1054 of the virtual dictionary 1229 (FIG. 12B) that comprises the portion of the current value that has already been decoded. In effect, there are two types of Copy codes: Copy codes that reference a range of positions in the output string 1052, and Copy codes that reference earlier portions of the current value.

As in the first embodiment, the output string 1030 contains a sequence of Add codes and Copy codes. Each Add code includes a sequence of one or more literal data values (e.g., a sequence of bytes or words, each of which can have any value). Each Copy code specifies a range of locations in the virtual dictionary 1050 that are to be duplicated or copied to produce a decoded portion of the input string 900. The Copy code may include a start position within the virtual dictionary and a length, or it may indicate start and end positions. During decoding, the output string 1030 of the compression process becomes the input string to the decoding process. Add codes are executed or decoded simply by adding the literal data values in the Add codes to a decoded output string. Copy codes are executed by copying the specified range of values from the virtual dictionary to the current endpoint of the decoded output string.

First Dictionary-Based Compression Process

Figure 11:
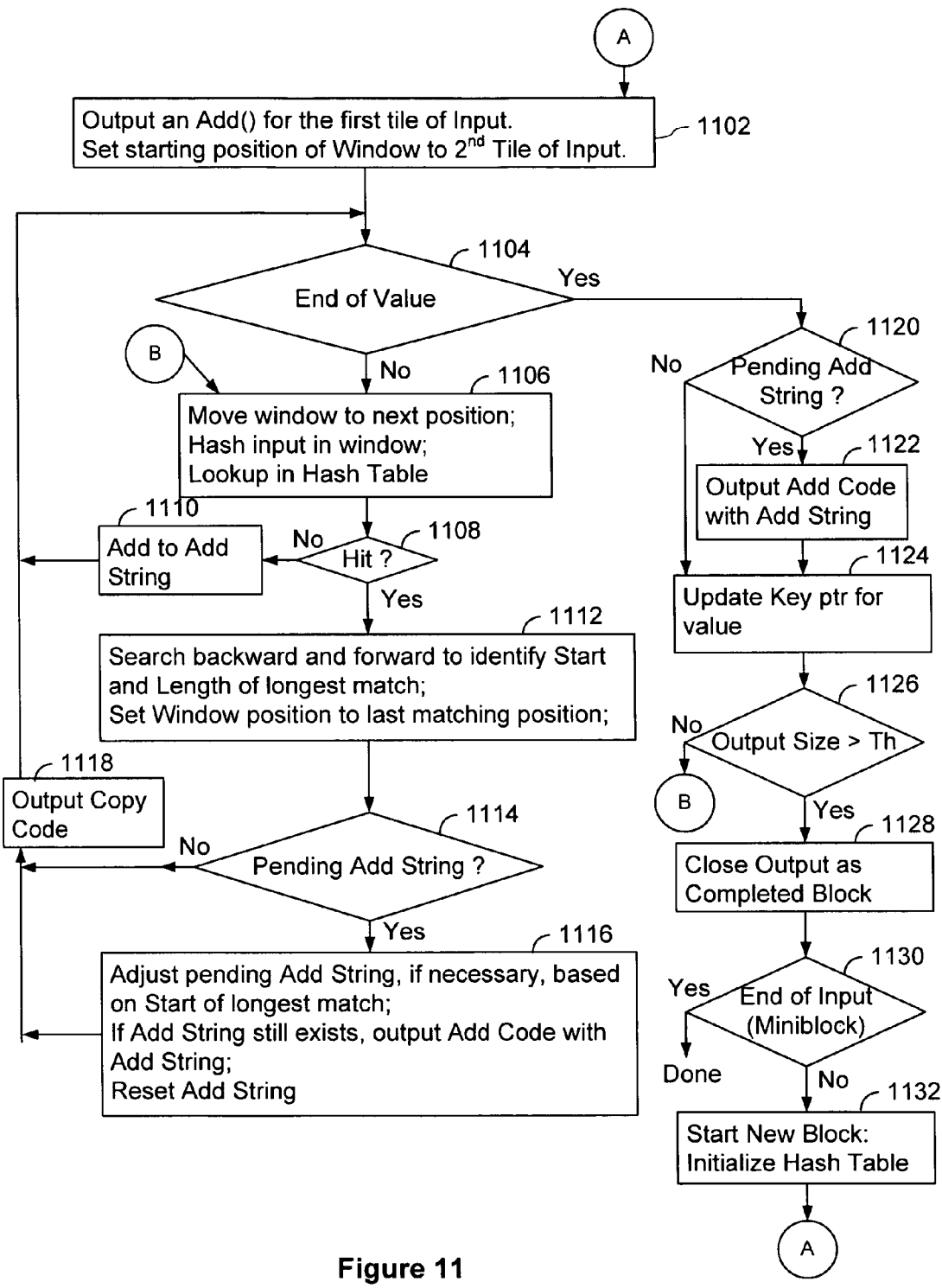
FIG. 11 is a flow chart of a data compression process compatible with the Bentley-McIlroy data compression method of FIG. 9 and the modified Bentley-McIlroy data compression method of FIGS. 10A and 10B.

Referring to FIG. 11, the dictionary-based compression process for compressing an input string of values begins by adding to the output string an Add code for the first tile of the input string (1102). In addition, the sliding window is positioned at the end of the first tile of the input string, in preparation for starting processing at the second tile of the input string.

If the process has not yet reached the end of a value (i.e., a value corresponding to a key in a table) (1104—No), the sliding window is moved to a next position, the windowed input is hashed and a lookup is performed on the resulting hash value (1106). If a matching entry is not found in the hash table (1018—No), a unit (e.g., byte or word) of the input string is added to the pending Add String (1110) and the process continues at 1104. The "pending Add String" is a string of data from the input string which will be inserted into the output as an Add code, unless some or all of the Add String is found to match a string in the dictionary.

If a matching entry is found in the hash table (1018—Yes), the dictionary location or locations identified by the matching entry are searched backward and forward to find the longest matching string (1112). The sliding window is repositioned to the last matching position of the current input value. If there is no pending Add String (1114—No), a Copy code identifying the longest match is added to the output string (1118). If there is a pending Add String (1114—Yes), the Add String is adjusted, if necessary, to remove any portion covered by the identified longest matching string (1116). This can be determined, for instance, based on the Start position of the longest match. If an Add String still exists after any pruning, an Add Code with the remaining Add String is added to the output string, the Add String is reset (1116), and a Copy code identifying the longest match is added to the output string (1118). After the Copy code is output, the process resumes at 1104.

If the process has reached the end of a value (i.e., a value corresponding to a key in a table) (1104—Yes), a number of operations are performed. If there is a pending Add String (1120—Yes), an Add Code with the Add String is output (1120), which completes the output for the current input value. The pointer or link for the key corresponding to the current input value is updated to point to the set of output codes (i.e., a sequence of one or more Copy codes and/or Add codes) for the current input value (1124).

If the size of the output string does not exceed a threshold value (1126—no), processing continues with the next input value at 1106. Otherwise (1126—yes) the output string is closed and becomes a completed block of compressed data (1128). If the process has reached the end of the input string (1130—yes), the compression process is completed. Otherwise (1130—no), processing for a new block is initiated by starting a new block and re-initializing the hash table (1132), and then resuming the process at 1102. In this case, however, the "first tile of the input string" is the first tile of the remaining portion of the input string (i.e., after the last processed block).

Decompression Process

If a compressed block has been compressed using the two tier compression process shown in FIG. 7, the process for decompressing any data in the block begins by reversing the last compression operation—labeled CM3 in FIG. 7. If the last compression operation was performed using an LZ or LZW compression process, the corresponding LZ or LZW decompression operation is performed in order to reconstruct a block 710 (FIG. 7) of compressed data, which includes keys and compressed values. For the purposes of the remainder of this discussion, we assume that the compressed block being processed is similar to block 710: a set of keys and at least one block or miniblock 702 of compressed values.

The process for fully decompressing (also called decoding) a compressed block of data is to execute all the Add codes and Copy codes in the compressed data. The execution of each code adds to the reconstructed string of values. If there are encoded or compressed keys in the compressed block, the corresponding decompression or decoding process may be preformed to recover the keys. If the values in a miniblock 702 (FIG. 7) were compressed using the first embodiment of the first dictionary based compression process described above, the decompression process uses the reconstructed string of values as the dictionary that is referenced by the Copy codes in the compressed data. However, if the values in a miniblock 702 were compressed using the second embodiment of the first dictionary based compression process described above (with reference to FIGS. 10A and 10B), the decompression process uses the virtual dictionary 1229 of FIG. 12B as the dictionary that is referenced by the Copy codes in the compressed data, as discussed above.

Figure 12A:
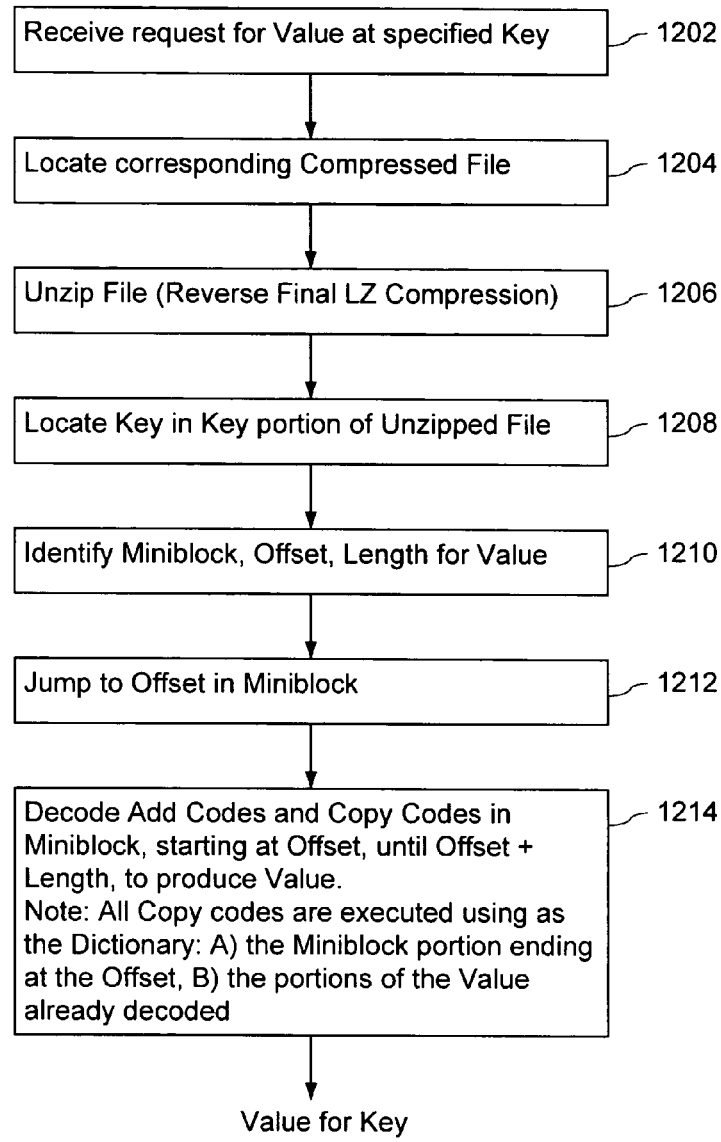
FIG. 12A is a flow chart of a data decompression process for decompressing a value corresponding to a specified key in a specified table, using compressed data produced by the modified Bentley-McIlroy data compression method.
Figure 12B:
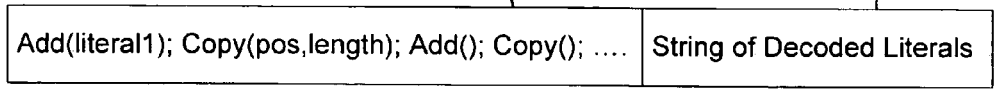
FIG. 12B depicts the virtual dictionary used by the data decompression process of FIG. 12A.

FIG. 12A represents a process of decoding the value for a specified key in a specified table or file, without having to decode all the preceding values in the same block or miniblock. This decoding process decodes compressed data produced by the second embodiment of the first dictionary based compression process, described above with reference to FIGS. 10A, 10B and 11. The decoding process begins upon receiving a request for the value at a specified key of a specified table (1202). The process locates the corresponding compressed file (1204) and then "unzips" that file (1206), for instance by performing an LZ or LZW decompression operation on the entire file. LZ and LZW decompression is typically very fast and efficient. At this point, the file will have a structure similar to that of block 710 in FIG. 7. The process continues by locating the specified key in the key portion of the unzipped file (1208). As described above, searching for key in the file may be facilitated by doing a lookup in a key index and then searching through a portion of the keys in the file to find the specified key.

Once the specified key is found, the link associated with the key is read so as to identify the miniblock, offset and length of the compressed value for that key (1210). The process reads the specified portion of the specified miniblock (1212), and then decodes the Add codes and Copy codes in the miniblock, starting at the specified offset and continuing until the end of the specified portion of the miniblock is reached (1214). The Copy codes reference a virtual dictionary, which includes (A) the portion of the encoded miniblock ending at the offset for the value being decoded, and (B) the portions (if any) of the value already decoded. There is no need to decode any other compressed values in the miniblock before decoding the value for the specified key. As a result, access to a specified key-value pair in a compressed file can be accomplished much more quickly than if a much larger portion of compressed block had to be decoded in order to access that key-value pair.

Each of the processes described above with reference to FIGS. 7 through 12B may include additional operations. Some of the operations described above may be eliminated or combined with other operations when so warranted by the context in which the process is performed. Further, some of the operations described above can be performed in a different order from the sequence or order described above.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A computer-implemented method of compressing data in a table data structure, comprising:
    accessing a data set within the table data structure, the data set having associated therewith a range of rows of the table data structure; wherein data items in the data set are represented by key-value pairs; wherein the key of each key-value pair uniquely corresponds to the value of the key-value pair;
    applying a first compression to the values of the key-value pairs in the data set to produce a first compressed output;
    applying a second compression, distinct from the first compression, to the keys of the key-value pairs in the data set to produce a second compressed output; and
    applying a third compression to the first compressed output and second compressed output to produce a first compressed output block, wherein the third compression is distinct from the first compression and second compression and the first compressed output block is stored in a computer readable medium.

2. The method of claim 1, wherein the first compression utilizes a first dictionary based compression that utilizes a first dictionary having first dictionary entries, the third compression utilizes a second dictionary based compression that utilizes a second dictionary having second dictionary entries, and each dictionary entry of the second dictionary is associated with a smaller quantity of input data than each dictionary entry of the first dictionary.

3. The method of claim 1, wherein the second compression utilizes is a prefix encoding compression that encodes differences between adjacent key values in the key values of the data set.

4. The method of claim 3, wherein the first compression utilizes a first dictionary based compression that utilizes a first dictionary of unlimited size and a search window that includes all values of the data set previously encoded by the first compression.

5. The method of claim 4, wherein the first compressed output includes a sequence of copy elements and add elements, the add elements each indicating a string of values to be added to a dictionary and to a reconstructed output, and the copy elements each indicating a dictionary position and quantity of data to be copied from the first dictionary, starting at the indicated dictionary position, to the reconstructed output.

6. The method of claim 4, wherein the third compression utilizes a second dictionary based compression that utilizes a second dictionary having a fixed size limit, and wherein each dictionary entry of the second dictionary is associated with a smaller quantity of input data than the each dictionary entry of the first dictionary.

7. The method of claim 1, ordering the data in the table data structure so that when a data item has a plurality of versions stored in the table data structure, the plurality of versions are stored adjacent to each other in the table data structure.

8. The method of claim 1, ordering the data in the table data structure so that when a data item has a plurality of versions stored in the table data structure, the plurality of versions are stored in a set of contiguous locations in the table data structure.

9. The method of claim 1, wherein the first compression identifies long common strings in the data, without limitation as to length of the common strings.

10. The method of claim 1, wherein at least one of the copy elements in the first compressed output identifies a contiguous portion of the data having a length greater than 16,384 bytes.

11. The method of claim 1, including stopping the application of the first compression and the second compression to the data set when the first compressed output reaches a predefined size threshold, applying the third compression to the first compressed output and the second compressed output to form the first compressed output block, resuming application of the first compression and second compression to a second portion of the data set to produce a third compressed output and a fourth compressed output until the third compressed output reaches the predefined size threshold, and applying the third compression to the third compressed output and fourth compressed to form a second compressed output block.

12. The method of claim 1, wherein
    the data in the table data structure corresponds to data associated with a plurality of URLs and the table includes a plurality of rows, each row corresponding to a distinct URL; and
    the method includes ordering rows of the table data structure in accordance with the corresponding URLs.

13. The method of claim 12, wherein
    the URLs each include a domain portion preceding a first slash character in the URL, the domain portion include a plurality of elements; and
    the method includes associating a respective key with each row of data in the table, the key including a first portion formed by reversing the elements of the domain portion of the URL corresponding to the respective row, and ordering the rows of data in the table data structure in accordance with their associated keys.

14. The method of claim 1, wherein
    the table data structure includes a plurality of columns, including a plurality of groups of columns; and
    method includes segregating the data set into a subsets corresponding to the groups of columns, and applying the first compression separately to the values in each of the subsets.

15. The method of claim 1, wherein the key of each key-value pair includes at least a row identifier and a column identifier.

16. The method of claim 1, wherein the key of each key-value pair includes a row identifier, a column identifier, and a timestamp.

17. A computer-implemented method of compressing data in a table data structure, comprising:
   accessing a data set within the table data structure, the data set having associated therewith a range of rows of the table data structure; wherein data items in the data set are represented by key-value pairs; wherein the key of each key-value pair uniquely corresponds to the value of the key-value pair;
   applying a first compression to the values of the key-value pairs in the data set to produce a first compressed output; and
   applying a second compression to the first compressed output and to uncompressed keys of the key-value pairs in the data set to produce a first compressed output block, wherein the second compression is distinct from the first compression and the first compressed output block is stored in a computer readable medium.

18. The method of claim 17, wherein the first compression comprises a first dictionary based compression that utilizes a first dictionary, the second compression comprises a second dictionary based compression that utilizes a second dictionary, and each dictionary entry of the second dictionary is associated with a smaller quantity of input data than the each dictionary entry of the first dictionary.

19. The method of claim 17, wherein the first compression comprises a first dictionary based compression that utilizes a first dictionary of unlimited size and a search window that includes all values of the data set previously encoded by the first compression, the second compression comprises a second dictionary based compression that utilizes a second dictionary having a fixed size limit, and each dictionary entry of the second dictionary is associated with a smaller quantity of input data than the each dictionary entry of the first dictionary.

20. A system for storing data, comprising:
   at least one processor;
   storage to store a table data structure, the table data structure including a plurality of rows and columns for storing data, wherein the rows have associated row identifiers, the columns have associated column identifiers, and each of a plurality of data items is stored in the table data structure at a respective cell in the table data structure specified by a respective row identifier and respective column identifier;
   executable instructions, executable by the at least one processor, including:
   instructions to access a data set within the table data structure, the data set having associated therewith a range of rows of the table data structure; wherein data items in the data set are represented by key-value pairs; wherein the key of each key-value pair uniquely corresponds to the value of the key-value pair;
   instructions to apply a first compression to the values of the key-value pairs in the data set to produce a first compressed output;
   instructions to apply a second compression, distinct from the first compression, to the keys of the key-value pairs in the data set to produce a second compressed output; and
   instructions to apply a third compression to the first compressed output and second compressed output to produce a first compressed output block, wherein the third compression is distinct from the first compression and second compression.

21. The system of claim 20, wherein a respective cell in the table data structure stores a plurality of data items, each the data items stored in the cell having associated therewith a respective timestamp, each of the plurality of data items stored in the cell having a same row identifier, a same column identifier, and a distinct timestamp.

22. The system of claim 20, wherein the first compression utilizes a first dictionary based compression that utilizes a first dictionary having first dictionary entries, the third compression utilizes a second dictionary based compression that utilizes a second dictionary having second dictionary entries, and each dictionary entry of the second dictionary is associated with a smaller quantity of input data than the each dictionary entry of the first dictionary.

23. A system for storing data, comprising:
   at least one processor;
   storage to store a table data structure, the table data structure including a plurality of rows and columns for storing data, wherein the rows have associated row identifiers, the columns have associated column identifiers, and each of a plurality of data items is stored in the table data structure at a respective cell in the table data structure specified by a respective row identifier and respective column identifier;
   executable instructions, executable by the at least one processor, including:
   instructions to access a data set within the table data structure, the data set having associated therewith a range of rows of the table data structure; wherein data items in the data set are represented by key-value pairs; wherein the key of each key-value pair uniquely corresponds to the value of the key-value pair;
   instructions to apply a first compression to the values of the key-value pairs in the data set to produce a first compressed output; and
   instructions to applying a second compression to the first compressed output and to uncompressed keys of the key-value pairs in the data set to produce a first compressed output block, wherein the second compression is distinct from the first compression.

24. A computer program product for use in conjunction with a computer system, the computer program product comprising a computer readable storage medium and a computer program mechanism embedded therein, the computer program mechanism comprising instructions for:
   accessing a data set within the table data structure, the data set having associated therewith a range of rows of the table data structure; wherein data items in the data set are represented by key-value pairs; wherein the key of each key-value pair uniquely corresponds to the value of the key-value pair;
   applying a first compression to the values of the key-value pairs in the data set to produce a first compressed output;
   applying a second compression, distinct from the first compression, to the keys of the key-value pairs in the data set to produce a second compressed output; and
   applying a third compression to the first compressed output and second compressed output to produce a first compressed output block, wherein the third compression is distinct from the first compression and second compression.

* * * * *